United States Patent [19]

Scandurra

[11] Patent Number: 4,661,996
[45] Date of Patent: Apr. 28, 1987

[54] METHOD AND APPARATUS FOR INDICATING RADIO FREQUENCY CARRIER LOSS IN REMOTELY CONTROLLED VEHICLES

[76] Inventor: Aldo M. Scandurra, 22 Monett Pl., Greenlawn, N.Y. 11740

[21] Appl. No.: 603,719

[22] Filed: Apr. 25, 1984

[51] Int. Cl.⁴ .................. H04B 1/16; H04B 17/00
[52] U.S. Cl. ................................ 455/205; 455/226; 455/229
[58] Field of Search ............ 455/205, 212, 213, 219, 455/222, 226, 229, 309, 312; 324/57 N; 340/870.18

[56] References Cited

U.S. PATENT DOCUMENTS

| | | | |
|---|---|---|---|
| 3,188,571 | 6/1965 | Michael | 455/219 |
| 3,568,068 | 3/1971 | Russell, Jr. | 455/212 |
| 3,851,253 | 11/1974 | Eastmond | 455/212 |
| 3,979,679 | 9/1976 | Bush et al. | 455/213 |

*Primary Examiner*—Ng: Jin F.
*Attorney, Agent, or Firm*—Fidelman, Wolffe & Waldron

[57] ABSTRACT

Method and apparatus for determining loss of a received frequency modulated carrier wherein the receiver includes a limiter and discriminator and generates an AGC voltage for controlling the gain of the receiver and producing an output signal from the discriminator having an output bandwidth in excess of that required for the information channel. The unused portion of the output bandwidth is used to sample the noise level voltage through a narrow band filter which upon reaching a selected magnitude provides an indication of the loss of the carrier. The invention, in another aspect, includes a gate control of the AGC voltage which for high signal values interrupts the action of the video networks deriving the noise level voltage.

5 Claims, 2 Drawing Figures

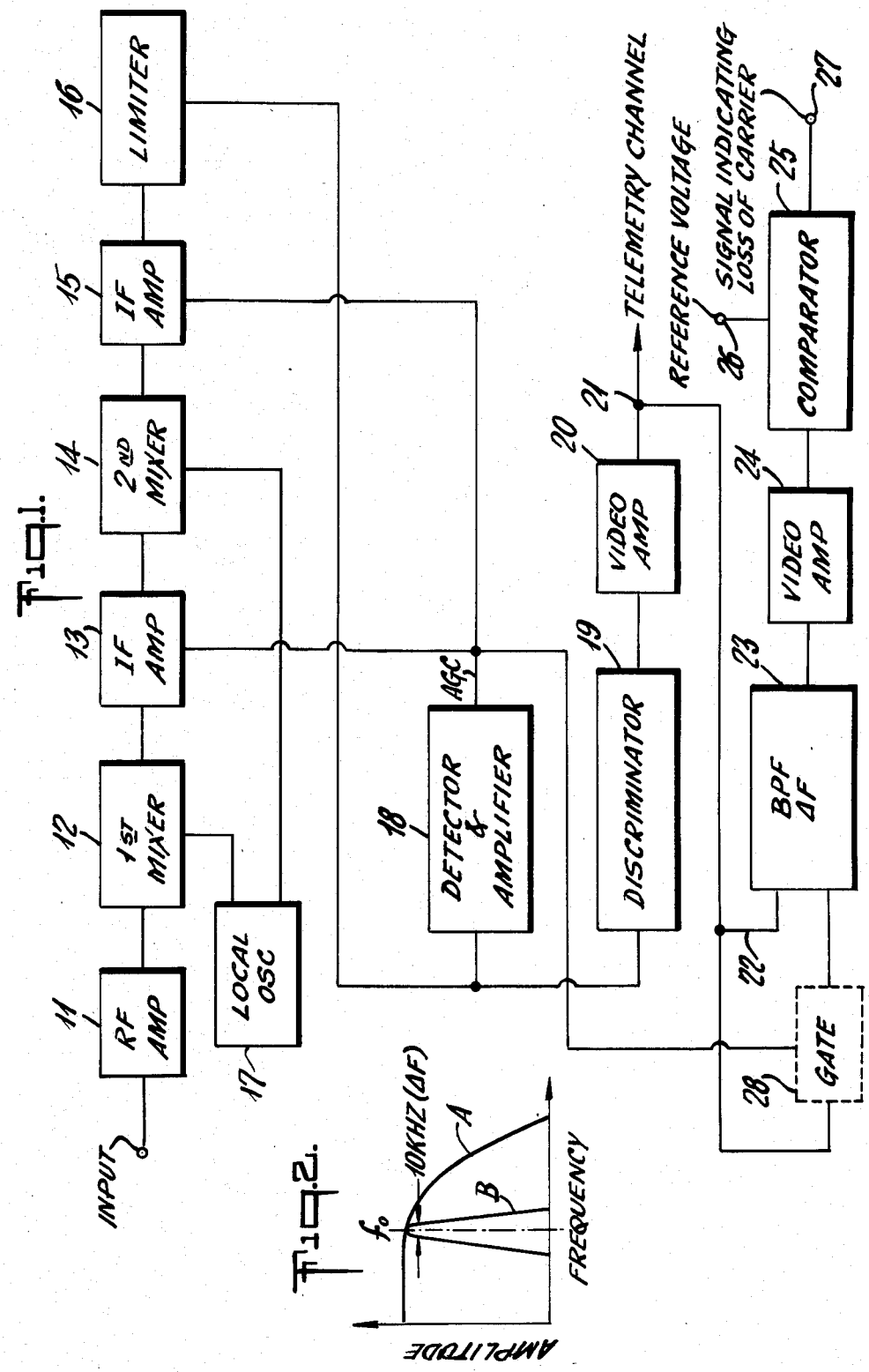

METHOD AND APPARATUS FOR INDICATING RADIO FREQUENCY CARRIER LOSS IN REMOTELY CONTROLLED VEHICLES

This invention relates to a method and apparatus for indicating radio frequency carrier loss at a receiver, such as the receiver in remotely controlled devices such as airborne and ground vehicles and more specifically to novel and improved circuitry and method of operation for determining when a received carrier has reached a level which prevents reliable transmission of telemetry information.

Remotely controlled vehicles, for instance, include receivers for receiving telemetry information transmitted by a control station and it is important that means be provided in the vehicle receiver to determine when the carrier signal reaches a level that prevents reliable continued transmission of the telemetry information. When such a determination is made, the information may be transmitted to the control station and means may be provided on the vehicle to indicate termination of control or perform certain preprogrammed operations. In the case of an airborne vehicle, it may be provided with a parachute that is released upon flight termination resulting from loss of carrier so that the vehicle upon reaching the ground can be retrieved.

Heretofore, the automatic gain control voltage (AGC) of the vehicle receiver was used to provide information to indicate loss of an adequate carrier signal for reliable vehicle control. When using the AGC signal to indicate loss of carrier, such signal must have a better signal-to-noise ratio than the information channel for vehicle control to achieve a reliable indication of carrier loss. Therefore, if for example, the telemetry information has a bandwidth of 500 KHZ, the AGC channel for an operational system must be less than 50 KHz which can only be derived by a second IF channel requiring much higher gain and stability considerations in the receiver. The receiver therefore must be a two channel receiver in which the narrower band channel is used for signal level indication. The use of a two-channel receiver adds material complication and increases space requirements.

This invention overcomes the difficulties heretofore encountered with known systems and provides novel and improved circuitry for determining loss of carrier and therefore loss of remote control of the vehicle that is superior and more economical than known systems.

Another object of the invention resides in the provision of a novel and improved system for determining loss of carrier used in the remote control of vehicles which not only provides a more accurate determination not possible with known systems but which also may be arranged to avoid false indication of carrier loss that may be occasioned by over-modulation of the carrier.

Still another object of the invention resides in the provision of novel and improved electronic circuitry for determining loss of carrier at the receiver.

This invention utilizes, in one aspect, a frequency modulated receiver, a band-pass filter connected to the video output of the receiver for isolating a narrow unused part of the video information bandwidth. When the noise in this portion of the unused part of the bandwidth reaches a predetermined level, a signal is provided to indicate that ground control is no longer effective. In another aspect, a gate is utilized to interrupt the signal to the band-pass filter when the AGC signal in the receiver is greater than a selected level and permits the video signal to be fed to the band-pass filter when the AGC signal falls to the selected level.

The above and other objects and advantages will become more apparent from the following description and accompanying drawings forming part of this application.

IN THE DRAWINGS

FIG. 1 is a block diagram of a radio receiver for a remotely controlled vehicle in accordance with the invention, and FIG. 2 is a graph illustrating the video bandwidth and the unused part of the bandwidth used to obtain a carrier loss indication.

As previously pointed out, known systems for the remote control of vehicles have utilized frequency modulated receivers carried by the vehicle and employed the automatic gain control signal, AGC, to determine when the received carrier strength has fallen to a level that renders continued vehicle control unreliable if not impossible. When utilizing AGC, the AGC signal-to-noise ratio must be far better than the signal-to-noise ratio on the information channel to obtain a reliable and positive indication. Accordingly, both the ground transmitter and the vehicle receiver must have a high degree of stability. As an example, if the information bandwidth is 500 KHz then the AGC channel to obtain an operational system must be less than 50 KHz and would also require a higher gain in stability in the receiver. The receiver would therefore become a two channel receiver in which the narrower band channel would be utilized for the flight termination. Even under such conditions and notwithstanding the added complication, the AGC signal would not provide a precise indication under all conditions that the carrier strength has reached the level at which the signal-to-noise ratio would prevent a reliable indication of carrier loss. The signal control function can be achieved through the use of a sub-carrier in the narrow band channel, but such a system requires additional circuitry in both the transmitter and receiver adding additional cost and producing a poorer signal-to-noise ratio.

This invention is based broadly upon the quieting effect, that is, noise suppression of a carrier in an FM receiver and under certain conditions, as will be explained, the AGC voltage may be used in combination therewith. In an FM receiver, the carrier functions to suppress the noise and as the carrier gets weaker, the noise increases. With this invention, however, the AGC voltage of itself is not utilized as the principal means for determining the carrier-to-noise ratio but rather an unused portion of the information bandwidth is utilized to detect the magnitude of the noise which is then compared to a standard in order to determine the point at which the carrier lacks sufficient strength to provide reliable control information. In a modified form of the invention, the AGC voltage is utilized to prevent measurement of the carrier noise level until the AGC voltage falls below a predetermined level. This procedure will prevent a false indication of the noise level in the event of over-modulation of the carrier which may result in distortion and thus produce the effect of a higher-than-actual noise level.

Referring now to the drawings and specifically to FIG. 1, the received radio frequency signal from the antenna or other source is fed to the input terminal 10 of the illustrated FM receiver which is then fed to the RF amplifier 11 and to a first mixer 12 which functions to lower the frequency of the original RF signal. The output of the mixer 12 is fed to an IF amplifier 13 and thence to a second mixer 14 to further reduce the frequency of the signal being amplified. The second mixer 14 is followed by a second IF amplifier 15 and a limiter 16. A local oscillator 17 feeds oscillator signals to the mixers 12 and 14 in the usual manner. The apparatus thus far described is in the nature of a conventional frequency modulated receiver and accordingly further description is not believed necessary.

The output of the limiter 16 is then fed simultaneously to a detector-amplifier 18 and to the discriminator 19. The detector-amplifier 18 is of conventional construction and produces an AGC signal at the output which is fed in the conventional manner to the IF amplifiers 13 and 15 to control the gain of the receiver. The discriminator 19 produces a video signal at terminal 21 which in the instant embodiment of the invention has a bandwidth of approximately 500 KHz of which as much as 350 KHz may normally be used for the information signals such as telemetry or the like. The output of the discriminator is then fed to the video amplifier 20 and the output which appears on terminal 21 is used for control of the vehicle. The output signal from the video amplifier 20 is also fed, according to one aspect of the invention, through a connection 22 directly to the band-pass filter 23. The band-pass filter 23 normally has a width $\Delta F$ of 10 KHz, though it may be of any desired value above or below 10 KHz, and is positioned in a part of the video bandwidth not utilized for the transmission of telemetry signals. It is apparent thus far that any noise occurring at the output of the video amplifier 20 will also appear at the output of the band-pass filter 23. The output of the band-pass filter 23 is then amplified by a video amplifier 24 and fed to a comparator 25 which also receives a predetermined reference voltage from the terminal 26. The magnitude of the reference voltage is selected to correspond with a magnitude of the noise that would function to prevent the reception of reliable telemetry or other information signals which in turn is a precise indication of carrier loss. The comparator 25 compares the output of the video amplifier 24 with the reference voltage and when that output equals or exceeds the reference voltage, a signal is produced on the terminal 27 which indicates loss of carrier and can be utilized on the vehicle to terminate further operation. For instance, in the case of drone aircraft, the signal can be utilized to terminate continued flight and release an appropriate parachute to permit the drone aircraft to return to ground and be retrieved. In the alternative, the presence of a signal at the terminal 27 can be used to automatically reverse the path of the drone which would bring it back within the range of the transmitting station.

As previously pointed out, the invention embodies an alternate mode of operation wherein the output signal on terminal 21 is fed through a normally closed gate 28 and then to the bandpass filter 23. The gate 28 is interconnected with the AGC voltage produced by the detector-amplifier 18 and the AGC voltage functions to open the gate 28 when that voltage falls to a predetermined level, for example 1 volt. In this way, a signal on the output terminal 27 indicating loss of carrier cannot be produced until the AGC voltage falls to the selected level. This procedure prevents an erroneous noise indication which may result from over-modulation of the transmitted carrier which will produce distortion of a magnitude that can be readily mistaken for noise and therefore produce an erroneous signal at the terminal 27 indicating loss of carrier. The utilization of the gate 28 prevents the occurrence of these false indications. When the AGC voltage however has fallen to the selected level, the gate opens and a signal is fed in the usual manner to the band-pass filter 23, the video amplifier 24 and comparator 25.

FIG. 2 is a graph showing one procedure for carrying out the invention. Curve A illustrates the bandwidth of the signal produced at the terminal 21 constituting the output of the video amplifier 20 which in the instant embodiment of the invention has a usable width of 500 KHz. Since the entire bandwidth is not utilized for informational signals, a portion of the bandwidth denoted by Curve B is utilized for noise detection and it is this band which is isolated by the band-pass filter 23 and fed to the video amplifier 24. As previously pointed out, the bandwidth $\Delta F$ in this embodiment of the invention is approximately 10 KHz though it may be of any suitable value greater or less than 10 KHz and since information does not appear in this portion of the band, only noise can be detected and when the noise exceeds a certain level, a signal will be produced at the output terminal 27 as previously described.

The circuitry described above and including the preferred form of the invention utilizing the gate 28 involves a minimum of circuitry and shielding within the receiver and enables the reduction of the IF gain to that required for limiting operations. For instance, the quieting sensitivity of a receiver is usually expressed in terms of 20 dB for a given RF level and with a receiver having a nominal bandwidth of 1 MHz, this is in the neighborhood of $-100$ dBm. At this level, the AGC voltage is negligible unless the bandwidth of the AGC channel is reduced to under 100 KC and adequate gain is provided to derive the AGC voltage. With this invention, modification of the normal AGC channel is not required since the circuit in accordance with this invention will detect the increase in the noise below $-100$ dBm and when the noise reaches a given level, the signal is triggered. This action can be effected usually within approximately 15 dB of the 20 dB quieting sensitivity point and as low as 6 dB quieting. This extends the use of the radio link to a greater range than any other network system known in the art including the use of a sub-carrier outside of the information channel.

It follows from the foregoing that an accurate and precise determination can be made of noise level and then when the automatic gain control signal is used as a level control for gate 28, as previously described, a far more reliable determination of the carrier level can be effected which does not involve the complication heretofore encountered and at the same time a higher degree of accuracy is effected.

While only certain embodiments of the invention have been illustrated and described, it is apparent that alterations, changes and modifications may be made without departing from the true scope and spirit thereof.

What is claimed is:

1. Apparatus for the determination of loss of a frequency modulated carrier resulting from the carrier-to-noise ratio received by a remotely controlled vehicle comprising a radio receiver including a limiter and discriminator for receiving a frequency modulated carrier signal containing telemetry information, said modulated signal having a bandwidth in excess of that utilized for said information, a narrow band-pass filter connected to said discriminator and tuned to an unused portion of the output bandwidth, a reference signal and a comparator for comparing the noise level at the output of said band-pass filter to said reference signal, said comparator producing an output signal when the noise level at least equals said reference signal, said receiver including detecting means for producing an AGC voltage for controlling gain of the receiver, a normally closed gate connected in series with the input to said band-pass filter and means connecting said AGC voltage to said gate, said gate being closed to prevent the output of said discriminator from being fed to said band-pass filter when said AGC voltage is above a predetermined value and opened to feed the output of the discriminator to said band-pass filter when said AGC voltage falls to at least said predetermined value.

2. Apparatus according to claim 1 including a video amplifier having its input connected to the output of said discriminator and its output connected to said band-pass filter.

3. Apparatus according to claim 1 wherein said band-pass filter has a bandwidth of the order of 10 KHz.

4. The method for determining the loss of carrier in a frequency modulated receiver used for the remote control of a vehicle wherein said receiver includes a limiter and discriminator, the latter producing a video output signal comprising the steps of transmitting a frequency modulated carrier to said receiver with the modulation carrier having a bandwidth greater than that required for carrying the telemetry information and containing a noise voltage, producing an output signal containing said telemetry information with said signal having a bandwidth in excess of that required for the telemetry information, filtering said output signal to isolate an unused portion of the output bandwidth from the remaining portion of the bandwidth utilized for said telemetry information, comparing the magnitude of the noise voltage on the isolated portion of said output bandwidth with a reference voltage and producing a signal indicating loss of carrier when said noise voltage exceeds said reference voltage, said receiver producing an AGC voltage for control of the gain of said receiver, said method further comprising the steps of connecting a gate in series with the input to said filter and feeding said AGC voltage to said gate whereby said gate will interrupt the signal to said filter when the AGC voltage exceeds a predetermined value and will feed said signal to said filter when said AGC voltage falls to at least said predetermined value.

5. The method according to claim 4 wherein said filter is tuned to pass a bandwidth of the order of 10 KHz.

* * * * *